United States Patent
Sato et al.

(10) Patent No.: US 7,508,431 B2
(45) Date of Patent: Mar. 24, 2009

(54) SOLID STATE IMAGING DEVICE (75) Inventors: Koichi Sato, Saitama (JP); Nobuaki Abe, Saitama (JP); Iwao Takemoto, Chiba (JP)

(73) Assignee: Hoya Corporation, Tokyo (JP)

( * ) Notice: Subject to any disclaimer, the term of this patent is extended or adjusted under 35 U.S.C. 154(b) by 694 days.

(21) Appl. No.: 11/153,536

(22) Filed: Jun. 16, 2005

(65) Prior Publication Data
US 2005/0280727 A1    Dec. 22, 2005

(30) Foreign Application Priority Data
Jun. 17, 2004    (JP)    ............... 2004-179642

(51) Int. Cl.
H04N 3/14    (2006.01)
(52) U.S. Cl. .................. 348/294; 257/98; 257/432
(58) Field of Classification Search .......... 348/294.4, 348/271, 340, 294, 272; 257/98, 294, 432
See application file for complete search history.

(56) References Cited

U.S. PATENT DOCUMENTS

| 6,069,350 | A | * | 5/2000 | Ohtsuka et al. | .......... | 250/208.1 |
| 6,307,243 | B1 | * | 10/2001 | Rhodes | ................. | 257/432 |
| 6,704,051 | B1 | | 3/2004 | Takahashi | | |
| 6,995,800 | B2 | * | 2/2006 | Takahashi et al. | ............ | 348/340 |
| 7,138,663 | B2 | * | 11/2006 | Hoshuyama | ................. | 257/98 |
| 2004/0100570 | A1 | * | 5/2004 | Shizukuishi | ................. | 348/272 |
| 2005/0030408 | A1 | * | 2/2005 | Ito et al. | ................. | 348/340 |

FOREIGN PATENT DOCUMENTS

JP    3461275    7/1999

OTHER PUBLICATIONS

English Language Abstract of JP 11-191867.

* cited by examiner

Primary Examiner—David L Ometz
Assistant Examiner—Ahmed A Berhan
(74) Attorney, Agent, or Firm—Greenblum & Bernstein, P.L.C.

(57) ABSTRACT

A solid state imaging device that comprises a first, a second, and a third pixel, and a micro lens is provided. The first pixel has a first color filter. The second pixel has a second color filter, of which the color is different from the color of the first color filter. The third pixel has a third color filter, of which the color is different from the colors of the first color filter and the second color filter. The micro lens covers the first, the second, and the third pixels neighboring each other.

11 Claims, 12 Drawing Sheets

Fig. 12

SOLID STATE IMAGING DEVICE

BACKGROUND OF THE INVENTION

1. Field of the Invention

The present invention relates to a solid state image device that can prevent color moire generation.

2. Description of the Related Art

An image receiving surface of a solid state imaging device, such as CMOS, CCD, CMD, BASIS, SIT, and so on is divided into a number of pixels. Light received at each pixel is converted into an electric signal. Each pixel is covered by one color filter of three primary color filters. An R (red) signal is generated by a pixel covered by a red color filter. A G (green) signal is generated by a pixel covered by a green color filter. A B (blue) signal is generated by a pixel covered by a blue color filter. A display surface of a monitor is divided into a number of display-blocks. A display-block, on the display surface, corresponds to a plurality of pixels, that are at the same relative location on the image receiving surface. The display-block is further divided into three emitting areas. Each emitting area emits R, G, or B light according to the RGB signals generated by the pixels.

A single pixel can generate one primary color signal, consequently the other primary color signals for the single display-block are interpolated from the signals generated by the pixels surrounding around single pixel. Due to color interpolation, color moire fringes are generated in areas, where spatial frequency is high. The color moire fringes result in an inaccurate picture being displayed on the monitor. Conventionally, generation of the color moire fringes is prevented by covering the image receiving surface with an optical-low pass filter, which limits the spatial frequency of the light reaching the imaging device.

On the other hand, an optical low-pass filter is expensive and large. Consequently, there are problems with decreasing the manufacturing cost of an imaging device and miniaturizing the imaging device.

SUMMARY OF THE INVENTION

Therefore, an object of the present invention is to provide a solid state imaging device without an optical low pass filter, which prevents generation of color moire fringes.

According to the present invention, a solid state imaging device that comprises a first, a second, and a third pixel, and a micro lens is provided. The first pixel has a first color filter. The second pixel has a second color filter, of which the color is different from the color of the first color filter. The third pixel has a third color filter, or which the color is different from the colors of the first color filter and the second color filter. The micro lens covers the first, the second, and the third pixel neighboring each other.

Further preferably, a solid state imaging device should comprise a diffusion filter. The diffusion filter is mounted between the micro lens and the first, the second, and the third pixels.

Further preferably, the first, the second, and the third color filter is one of an R filter, a G filter, and a B filter.

Further preferably, a solid state imaging device is a CMOS type.

Further preferably, the first, the second, and the third pixels comprise a photoelectric conversion element. The photoelectric conversion element is arranged near an optical axis of the micro lens.

Furthermore preferably, a solid state imaging device comprises a fourth pixel. The fourth pixel is covered by the single micro lens. The fourth pixel has a fourth color filter. The color of the fourth color filter is the same as that of the first color filter. Transmittance of the fourth color filter is higher than that of the first color filter.

Furthermore preferably, a solid state imaging device comprises a fourth pixel. The fourth pixel is covered by the single micro lens. The fourth pixel comprises a photoelectric conversion element. The transmittance range between the micro lens and the photoelectric conversion element is equal to the whole range of visible light.

Furthermore preferably, the fourth pixel is covered by a transparent and colorless material.

Furtherstill preferably, the fourth pixel generates a fourth signal. A luminance signal of the first, second, third, and fourth pixels covered by the single micro lens is generated based on the fourth signal.

According to the present invention, a signal processor comprising an input portion and an output portion is provided. An input portion receives an image signal from a solid state imaging device. The solid state imaging device comprises a first, a second, and a third pixel, and a micro lens. The first pixel has a first color filter. The second pixel has a second color filter, of which the color is different from the color of the first color filter. The third pixel has a third color filter, of which the color is different from the colors of the first color filter and the second color filter. The micro lens covers the first, the second, and the third pixel neighboring each other. An output portion sends the image signal to a monitor for displaying an image captured by the imaging device. The image signal comprises first, second, and third signals. The first, second, and third signals are respectively generated by the first, the second, and the third pixels. The first, the second, and the third pixels, that are covered by the single micro lens, comprises a pixel-block. The monitor comprises a display surface. The display surface is divided into a plurality of display-blocks. Each of the display-blocks respectively corresponds to each of the pixel-blocks. The first, the second, and the third color filters respectively correspond to a first, a second, and a third color. The first, the second, and the third signals, generated by the single pixel-block, are respectively output as signals of the first, the second, and the third colors for the display-block corresponding to the pixel-block.

According to the present invention, another signal processor comprising an input portion and an output portion is provided. An input portion receives an image signal from a solid state imaging device. The solid state imaging device comprises a first, a second, a third, and a fourth pixel, and a micro lens. The first pixel has a first color filter. The second pixel has a second color filter, of which the color is different from the color of the first color filter. The third pixel has a third color filter, of which the color is different from the colors of the first color filter and the second color filter. The fourth pixel has a fourth color filter. The color of the fourth color filter is the same as that of the first color filter. The transmittance of the fourth color filter is higher than that of the first color filter. The micro lens covers the first, the second, the third, and the fourth pixels neighboring each other. The output portion sends the image signal to a monitor for displaying an image captured by the imaging device. The image signal comprises first, second, third, and fourth signals. The first, the second, the third, and the fourth signals are respectively generated by the first, the second, the third, and the fourth pixels. The first, the second, the third, and the fourth pixels, that are covered by the single micro lens, comprise a pixel-block. The monitor comprises a display surface. The display surface is divided into a plurality of display-blocks. The display-blocks correspond to the pixel-blocks. The first color filter corresponds to a first color. The fourth signal is output as a signal of the first color for the display-block corresponding to the pixel-block when the fourth signal is less than a designated threshold level. The first signal is output as the signal of the first color for the display-block corresponding to the pixel-block when the fourth signal exceeds the designated threshold level.

Furthermore preferably, the fourth pixel comprises a photoelectric conversion element. The photoelectric conversion element generates a saturation signal. The saturation signal is the highest level signal, that the photoelectric conversion element can generate. The designated threshold level is decided based on a level of the fourth signal, so that the fourth signal is less than the saturation signal.

According to the present invention, another signal processor comprising an input portion is provided. An input portion receives an image signal output from a solid state imaging device. The solid state imaging device comprises a first, a second, a third, and a fourth pixel and a micro lens. The first pixel has a first color filter. The second pixel has a second color filter, of which the color is different from the color of the first color filter. The third pixel has a third color filter, of which the color is different from the colors of the first color filter and the second color filter. The fourth pixel comprises a photoelectric conversion element. A transmittance range between the micro lens and the photoelectric conversion element is equal to the whole range of visible light. The micro lens covers the first, the second, and the third pixels neighboring each other. The image signal comprises first, second, third, and fourth signals. The first, the second, the third, and the fourth signals are respectively generated by the first, the second, the third, and the fourth pixels. The luminance signal at the first, the second, the third, and the fourth pixel, covered by the single micro lens, is generated based on the fourth signal.

BRIEF DESCRIPTION OF THE DRAWINGS

The objects and advantages of the present invention will be better understood from the following description, with reference to the accompanying drawings in which.

DESCRIPTION OF THE PREFERRED EMBODIMENTS

The present invention is described below with reference to the embodiments shown in the drawings.

Figure 1:
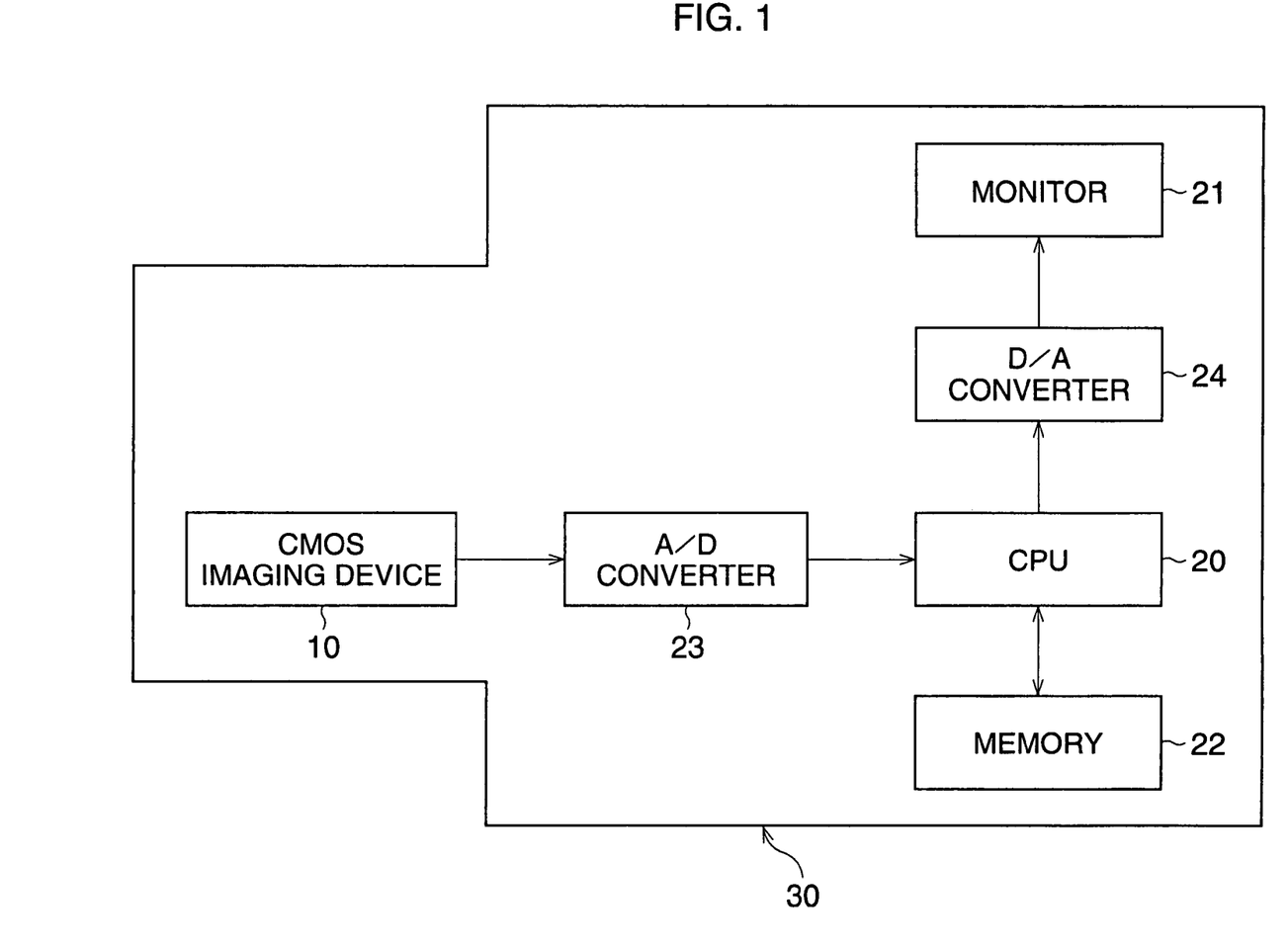
FIG. 1 schematically illustrates an electrical structure of a first embodiment.

FIG. 1 schematically illustrates an electrical structure of a first embodiment.

The digital still camera 30 comprises a CMOS imaging device 10, a CPU 20, a monitor 21, and a memory 22. The CPU 20 is connected to the imaging device 10 via an analogue-digital (A/D) converter 23. The A/D converter 23 converts an image signal generated by the imaging device 10 from an analogue signal to a digital signal. The CPU 20 carries out some signal processes on the image signal. Some of the signal processes are, for example, a white balance process, an outline correction process, gamma correction process, Y/C separation process, and so on.

The image signal is sent to the memory 22 after the CPU 20 carries out the processes. The memory 22 stores the image signal.

Or the image signal is sent to digital-analogue (D/A) converter 24 after the CPU 20 carries out the processes. The D/A converter 24 converts the imaging signal from a digital signal to an analogue signal. The image signal from the D/A converter 24 is sent to the monitor 21. The monitor 21 displays the image captured by the imaging device 10 based on the image signal.

Figure 2:
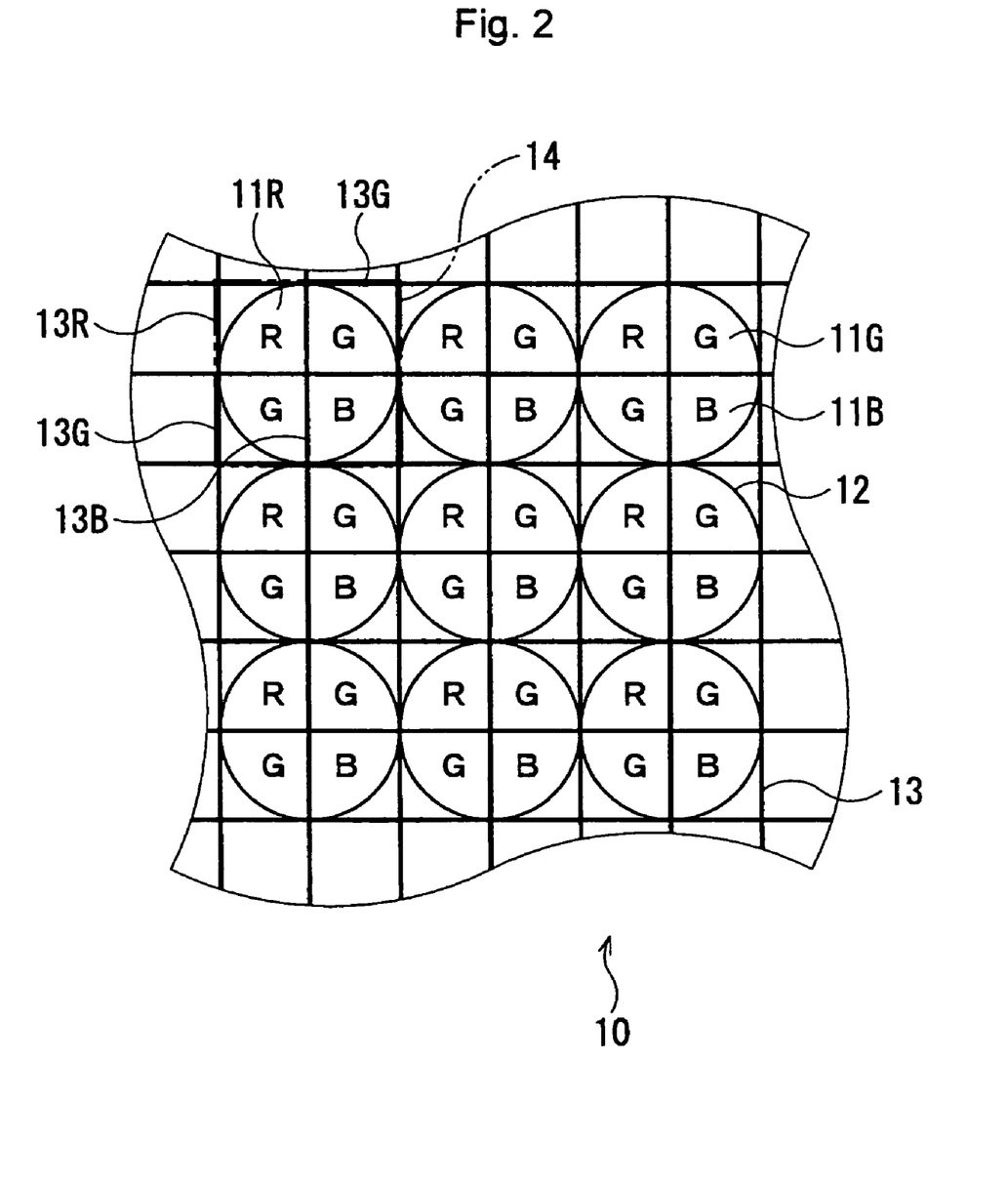
FIG. 2 illustrates an enlarged image receiving surface of the first embodiment.

FIG. 2 illustrates an enlarged image receiving surface of the imaging device 10.

The image receiving surface comprises a plurality of pixels 13 arranged in a matrix. Each pixel 13 comprises a photodiode under an aperture. An electrical charge is generated by the PD according to an amount of light received by a pixel 13. A signal is output from each pixel 13 according to the electrical charge.

Each pixel 13 is covered by one color filter, that is either a red, green, or blue color filter 11R, 11G, or 11B. A first pixel 13R is covered by a red filter 11R. A second pixel 13G is covered by a green filter 11G. A third pixel 13B is covered by a blue filter 11B. A red, a green, and a blue filter are arranged on the pixels 13 according to the Bayer color array.

A pixel-block 14 comprises a first pixel 13R, two second pixels 13G, 13G, and a third pixel 13B, which neighbor each other. Each pixel-block 14 is covered by a single micro-lens 12.

Figure 3:
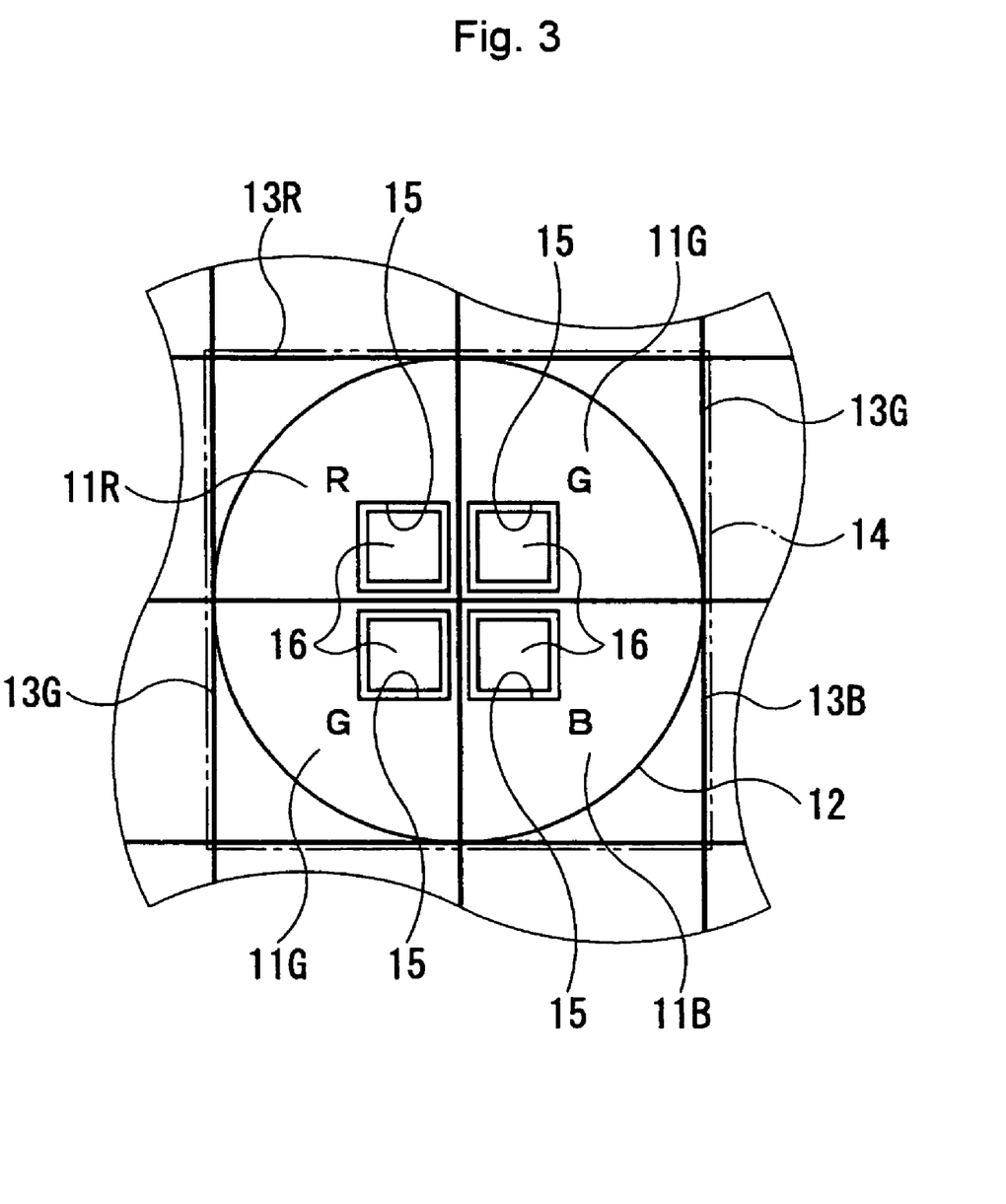
FIG. 3 illustrates an enlarged pixel-block of the first embodiment.

FIG. 3 illustrates an enlarged pixel-block 14.

A photodiode PD 16 and an aperture 15 for exposing light to the PD 16 are formed near an optical axis of the micro lens 12. In other words, the PD 16 and the aperture 15 are located near a center of the pixel-block 14. The location of PD 16 in the pixel 13 can be arranged freely because the imaging device 10 is a CMOS type.

Light that is incident to a micro lens 12, is condensed. The condensed light is received by each PD 16 of the first pixel 13R, the second pixels 13G, 13G, and the third pixel 13B in the pixel-block 14.

The first pixel 13R in the pixel-block 14 outputs an R signal according to an amount of the red component in the incident light through the micro lens 12. The second pixel 13G in the pixel-block 14 outputs a G signal according to an amount of the green component in the incident light. The third pixel 13B in the pixel-block 14 outputs a B signal according to an amount of blue component of the incident light.

RGB signals output from a plurality of pixels on the image receiving surface comprise an image signal described above.

The RGB signals are sent to the CPU 20. As described above, and the CPU 20 carries out some signal processes on the RGB signals. Some signal processes include a correlation-process as explained below.

Figure 4:
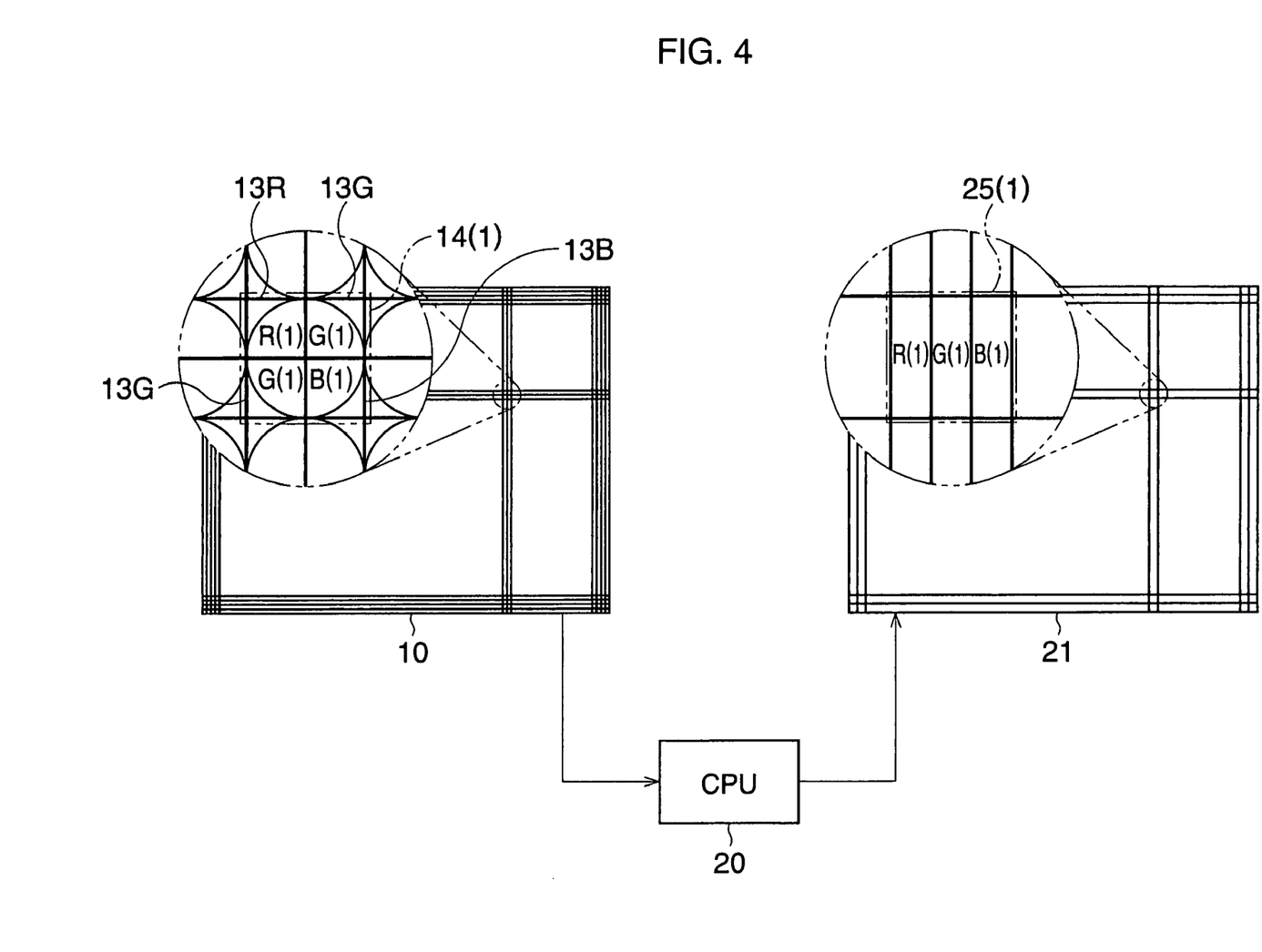
FIG. 4 explains the correlation of a pixel-block between a display-block.

The correlation-process is explained with reference to FIG. 4. FIG. 4 explains the correlation of a pixel-block and a display-block.

A display surface of a monitor 21 comprises a plurality of display-blocks 25, in the same way as an image receiving surface comprises a plurality of pixels 15. A display-block 25(1) corresponds to pixel-block 14(1), of which the relative location on the image receiving surface is the same as that of the display-block 25(1) on the monitor surface.

In the correlation-process, the CPU 20 correlates RGB signals R(1), G(1), and B(1) output from a pixel-block 14(1) with a display-block 25(1). The RGB signals R(1), G(1), and B(1) are sent to the monitor 21 as RGB signals for the display-block 25(1). The display-block 25(1) emits RGB light according to the RGB signals R(1), G(1), and B(1). In addition, the RGB signals R(1), G(1), and B(1) corresponding to the display-block 25(1), are stored at a memory for recording For example, the CPU 20 comprises RAM as a temporary memory for signal processing. The RAM comprises the same number of storing areas for an image signal as there are pixel-blocks of the image receiving surface. Each storing area corresponds to each pixel-block 14. The color signal R, G, and B signals are stored in each storing area. R, G, and B signals are respectively output from one first pixel, two second pixels, and one third pixel 13R, 13G, 13G, and 13B, comprising a single pixel-block. Each display-block 25 corresponds to each storing area. Each display-block 25 emits RGB light according to the RGB signal stored in the storing area corresponding to each display-block.

As described above, interpolation of the color signals is unnecessary for the imaging device 10 because actual RGB signals are output from each pixel-block 14. This results in the prevention of color moire fringes. Further, an optical low-pass filter is unnecessary for preventing the generation of color moire fringes. Consequently, the manufacturing cost of the imaging device can be reduced and miniaturizing the imaging device can be achieved.

In addition, an image without color moire fringes can also be displayed on a monitor other than the monitor 21, which is connected with the memory 22.

Figure 5:
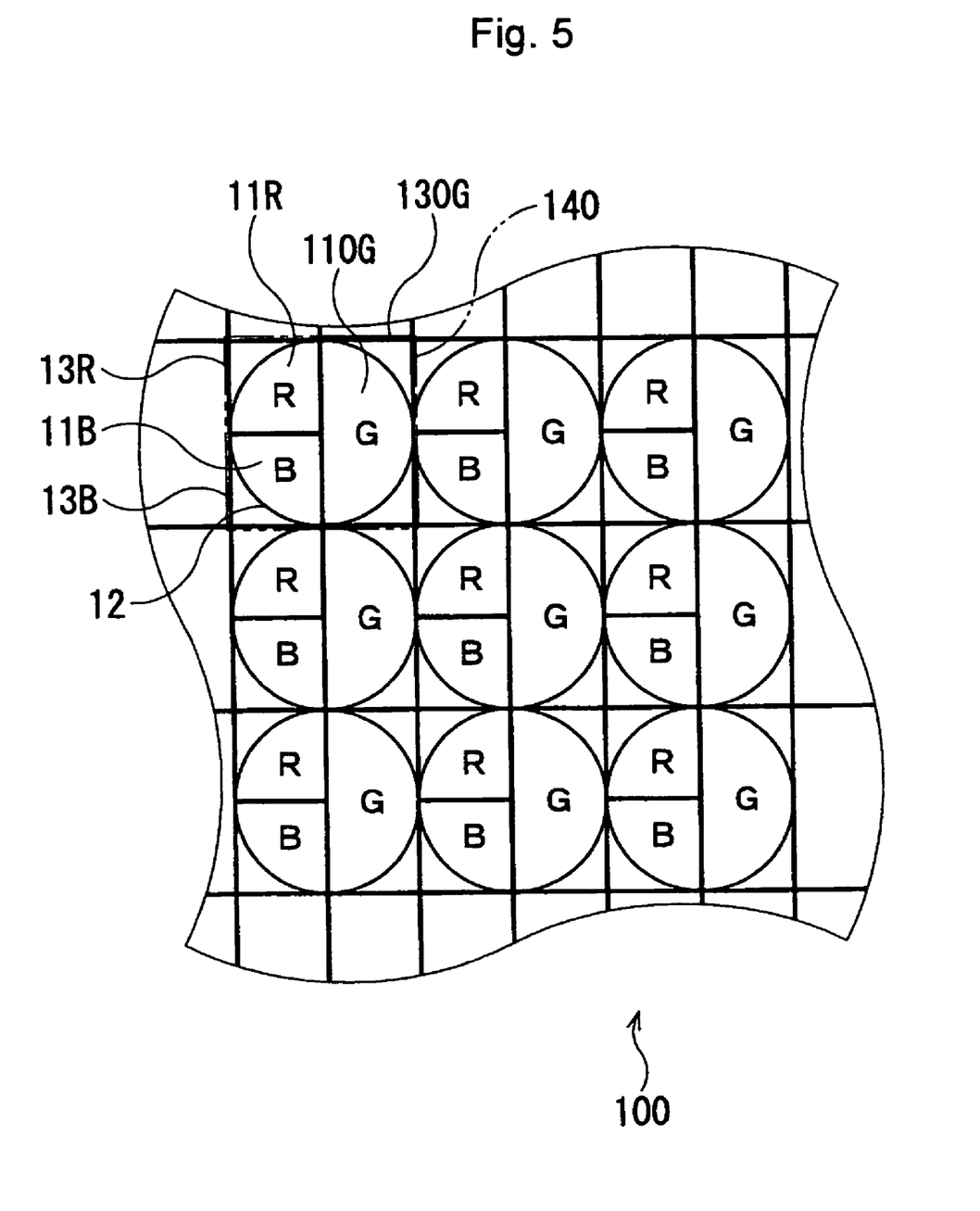
FIG. 5 illustrates an enlarged image receiving surface of the second embodiment.

The second embodiment is explained below with reference to FIG. 5. FIG. 5 illustrates an enlarged image receiving surface of an imaging device 100. The same symbols are used for the structures that are the same as those in the first embodiment. The second embodiment is different from the first embodiment mainly regarding the area of the second pixels.

An image receiving surface of the imaging device 100 comprises first, second, and third pixels 13R, 130G, and 13B. The first, second, and third pixels 13R, 130G, and 13B are respectively covered by R, G, and B color filters 11R, 110G, and 11B, the same as in the first embodiment. The area size of the first pixel 13R is the same as that of the third pixel 13B. The area size of the second pixel 130G is twice as large as that of the first or the third pixel 13R, 13B. There are alternately arranged columns, one having first and third pixels 13R, 13B and the other having second pixels 130G on the image receiving surface.

A pixel-block 140 comprises a first, a second, and a third pixel 13R, 130G, and 13B. A pixel-block 140 is covered by a single micro lens 12. The other structures are the same as those of the first embodiment.

The interpolation of RGB signals is not necessary for the imaging device 100 because actual RGB signals are output from each pixel-block 140. In addition, the color filter arrangement of the second embodiment is simpler than that of the first embodiment. Consequently, it is easy to manufacture the imaging device 100.

Figure 6:
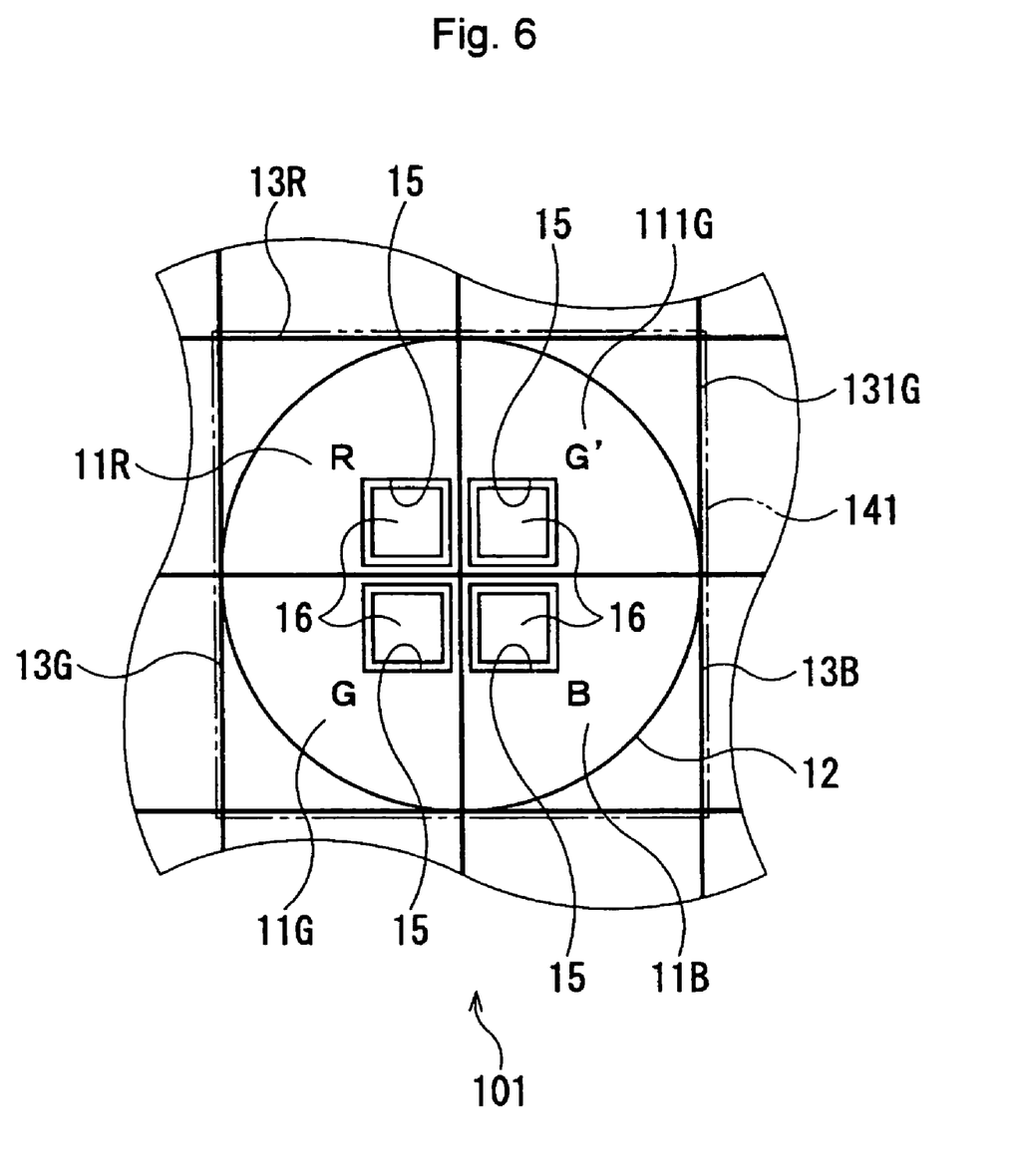
FIG. 6 illustrates an enlarged pixel-block of the third embodiment.

The structure of a third embodiment is explained below with reference to FIG. 6. FIG. 6 illustrates an enlarged pixel-block 141 of an imaging device 101. The same symbol is used for the structure that is the same as that in the first embodiment. The CPU in this embodiment has the same symbol as that in the first embodiment, however its function is partly different from that in the first embodiment. The third embodiment is different from the first embodiment regarding the pixels comprising the pixel-block.

Each pixel-block 141 comprises a first, a second, a third, and a fourth pixel 13R, 13G, 13B, and 131G. The first, second, and third pixels 13R, 13G, 13B are respectively covered by R, G, and B color filters 11R, 11G, 11B, the same as in the first embodiment. The fourth pixels 131G are covered by G color filters 111G, of which transmittance is higher than that of the second pixel 13G. Each pixel-block 141 is covered by a single micro lens 12 on the color filters, the same as in the first embodiment. A photodiode PD 16 and an aperture 15 of fourth pixels 131G are formed near an optical axis of the micro lens 12 in the same as for the other pixels. The other structures are the same as those of the first embodiment.

The imaging device 101 can output a G signal at two different sensitivities from each pixel-block 141. The fourth pixel 131G has higher sensitivity but is effective over a narrow illuminance range than the second pixel 13G. The second pixel 13G has lower sensitivity but is effective over a greater illuminance range than the fourth pixel 131G.

In this embodiment, the CPU 20 carries out a selection-process in addition to the processes carried out by the CPU 20 of the first embodiment. In the selection-process, the CPU 20 selects either a G signal generated by the second pixel 13G or a G signal generated by the fourth pixel 131G. The selected G signal is processed as a G signal by the pixel-block 141 in the following signal processes.

At first, the CPU 20 judges if G signal generated by the fourth pixel 131G is lower than a designated threshold level or not. The designated threshold level is decided based on a level of the fourth signal, so that the fourth signal is less than saturation signal.

The G signal from the fourth pixel 131G is selected if the G signal from the fourth pixel 131G is lower than the threshold level. On the other side, G signal generated by the second pixel 13G is selected if the G signal from the fourth pixel 131G is higher than the threshold level.

After the selection-process, the CPU carries out a correlation-process, for the selected G signal, selected in the selection-process. In the correlation-process of this embodiment, the CPU correlates to the selected G signal with the display-block 25, corresponding to the pixel-block 141, that outputs the selected G signal.

The G signal from the fourth pixel 131G is used for displaying the green component of light for the display-blocks 25, that correspond to the pixel-blocks 141 where darker light is received. On the other hand, the G signal from the second pixel 13G is used for displaying the green component of light for the display-blocks 25, that correspond to the pixel-blocks 141, where brighter light is received. Consequently, a still camera used in this embodiment is able to clearly capture an image having a wide range of brightness.

Figure 7:
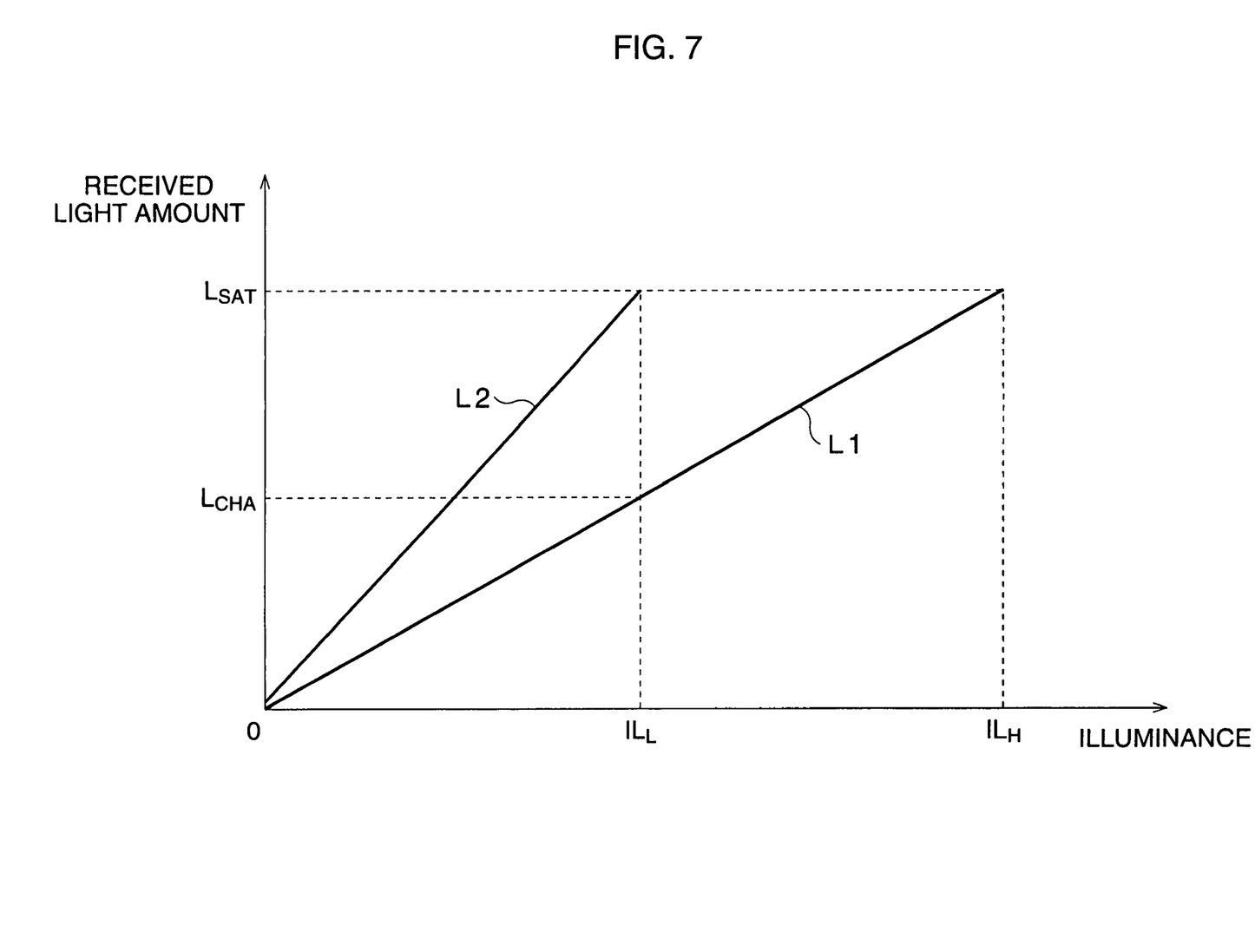
FIG. 7 is the chart showing the correlation between the illuminance to a micro lens and the received light amount at the second and the fourth pixel.

The effect with the still camera is explained below in more detail with reference to FIG. 7. FIG. 7 is the chart showing the correlation between the illuminance of the incident light to a micro lens 12 and the received light amount at the second and fourth pixel 13G, 131G. In FIG. 7, the first line L1 shows the correlation between the illuminance and the received light amount at the second pixel 13G. On the other hand, the second line L2 shows the correlation between the illuminance and the received light amount at the fourth pixel 131G. Furthermore, the maximum light level $L_{SAT}$ of the light received by the photodiodes comprising the second and fourth pixels 13G and 131G, is equal.

The incident light to a micro lens 12 is transmitted through the G color filter at the second and the fourth pixel 13G, 131G. The light transmitted through the G color filter at the second pixel 13G is received by the second pixel 13G. The light transmitted through the G color filter at the fourth pixel 131G is received by the fourth pixel 131G. The amount of light received at a fourth pixel 131G is more than that at the second pixel 13G owing to a difference of transmittance. Consequently, the fourth pixel 131G is more sensitive to incident light than the second pixel 13G.

An imaging device 101 is able to clearly capture a dark part of a whole image by using the G signal generated by a fourth pixel 131G. Namely, a low-level luminance signal corresponding to the illuminance of $0 \sim IL_L$ is calculated from G signal for the amount of light received in the range of $0 \sim L_{SAT}$ by the fourth pixel 131G.

Furthermore, an imaging device is also able to capture bright part of the image by using the G signal generated by the second pixel 13G. Namely, a high-level luminance signal corresponding to the illuminance of $IL_L \sim IL_H$ is calculated from G signal for the amount of light received in the range of $L_{CHA} \sim L_{SAT}$ by the second pixel 13G.

Figure 8:
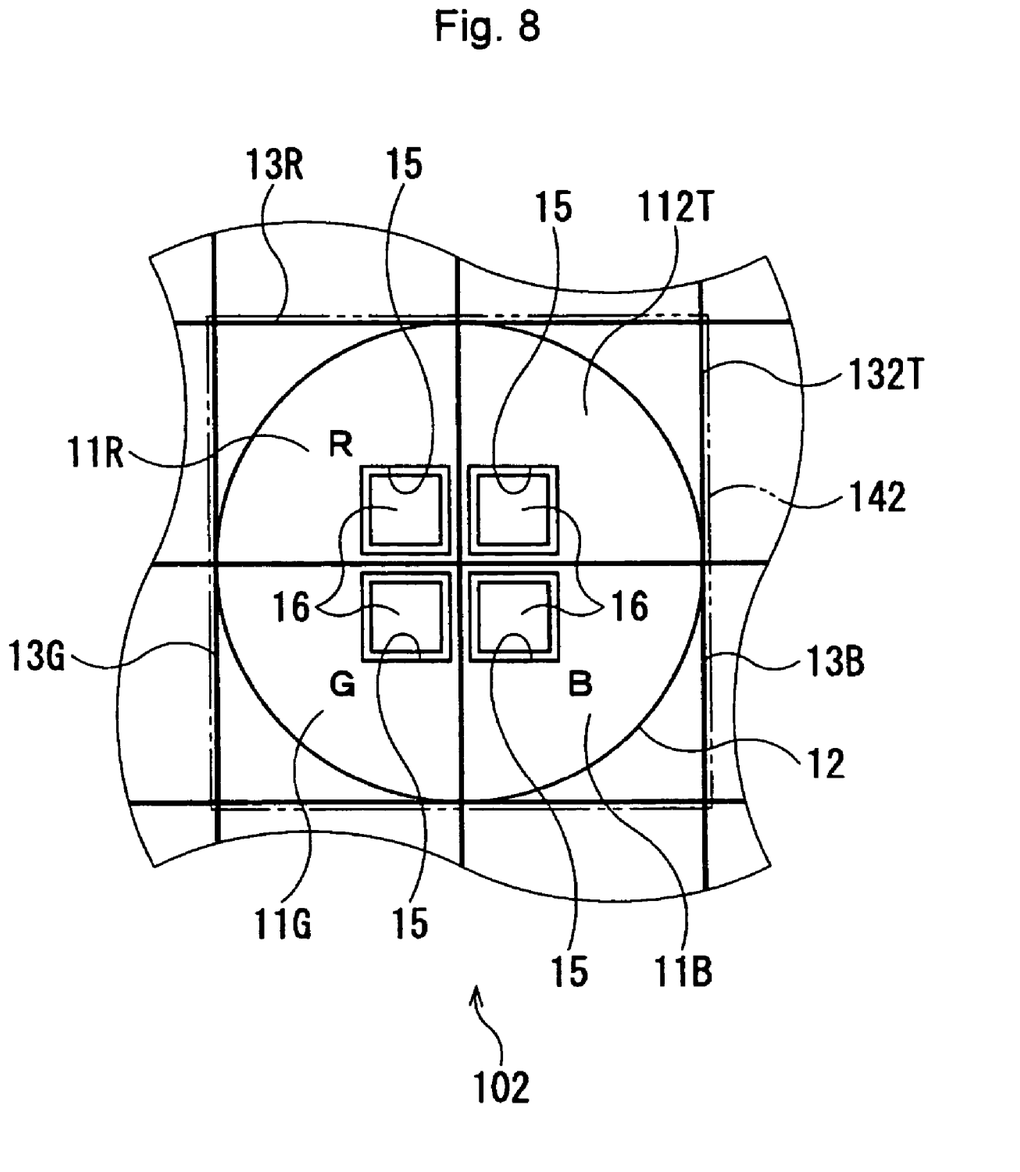
FIG. 8 illustrates an enlarged pixel-block of the fourth embodiment.

The structure of the fourth embodiment is explained below with reference to FIG. 8. FIG. 8 illustrates an enlarged pixel-block 142 of an imaging device 102. The same symbol is given to the structure that is the same as that in the first embodiment. The CPU for this embodiment has with the same symbol as that in the first embodiment, however its function is partly different from that in the first embodiment. The fourth embodiment is different from the first embodiment mainly regarding the pixels comprising the pixel-block.

Each pixel-block 142 comprises a first, second, third, and fourth pixel 13R, 13G, 13B, and 132T. The first, second, and third pixels 13R, 13G, 13B are respectively covered by R, G, and B color filters 11R, 11G, and 11B, the same as the first embodiment. The fourth pixels 132T are covered by a transparent and colorless material 112T instead of a color filter. A transparent and colorless material 112T can transmit enough visible light. Each pixel-block 142 is covered by a single micro lens 12 on the color filters 11R, 11G, and 11B and the same transparent and colorless material 112T as in the first embodiment. A photodiode PD 16 and an aperture 15 for the fourth pixel 132T are formed near an optical axis of the micro lens 12. The other structures are same as those of the first embodiment.

The CPU 20 of this embodiment generates a luminance signal for a pixel-block 142 based on a signal generated by the fourth pixel 132T instead of the RGB signals.

A more accurate image can be displayed with this embodiment. This is because the imaging device 102 can generate a more accurate luminance signal for each pixel-block directly based on the signal generated by the fourth pixel 132T without an RGB signal.

Figure 9:
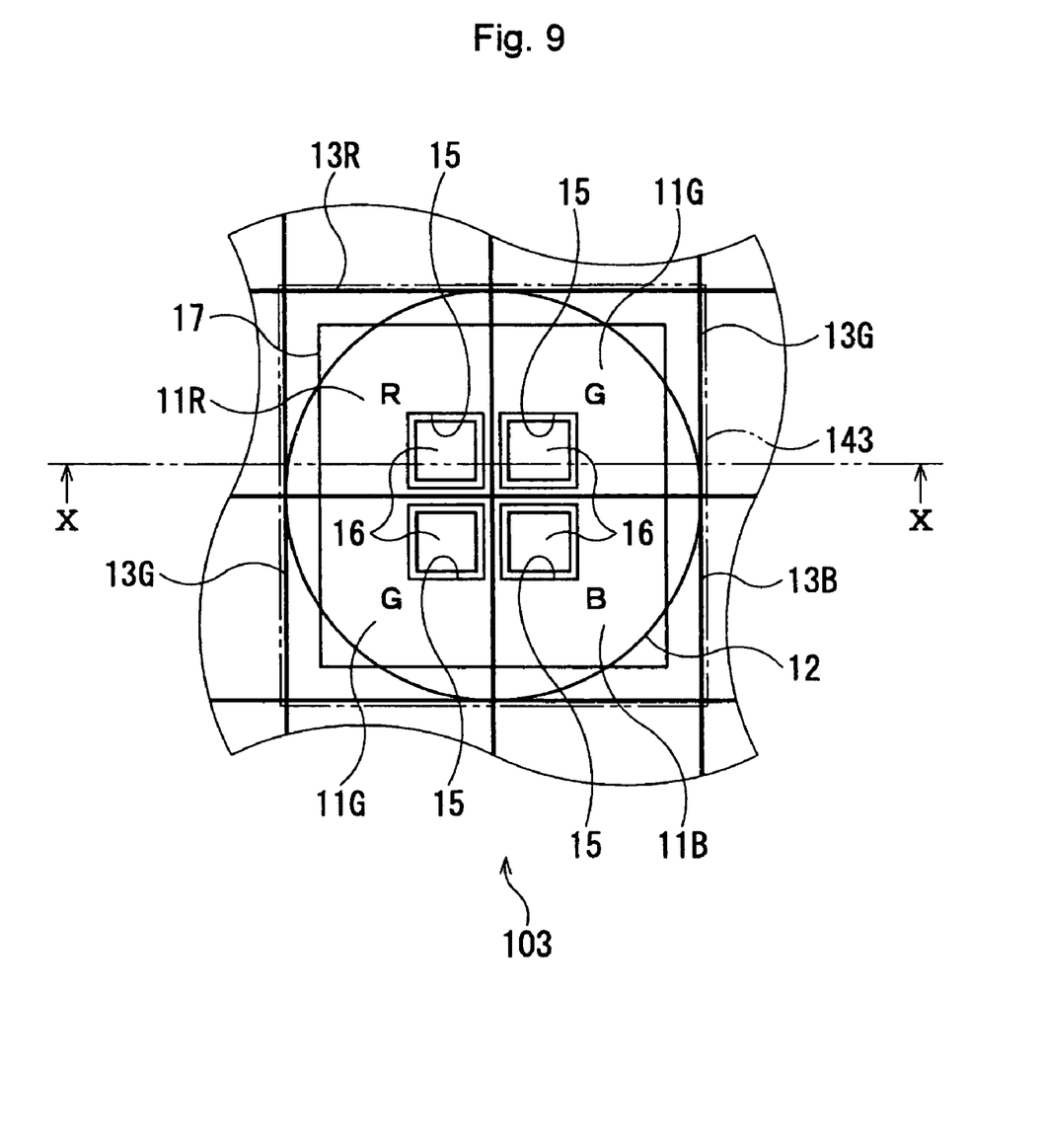
FIG. 9 illustrates an enlarged pixel-block of the fifth embodiment.
Figure 10:
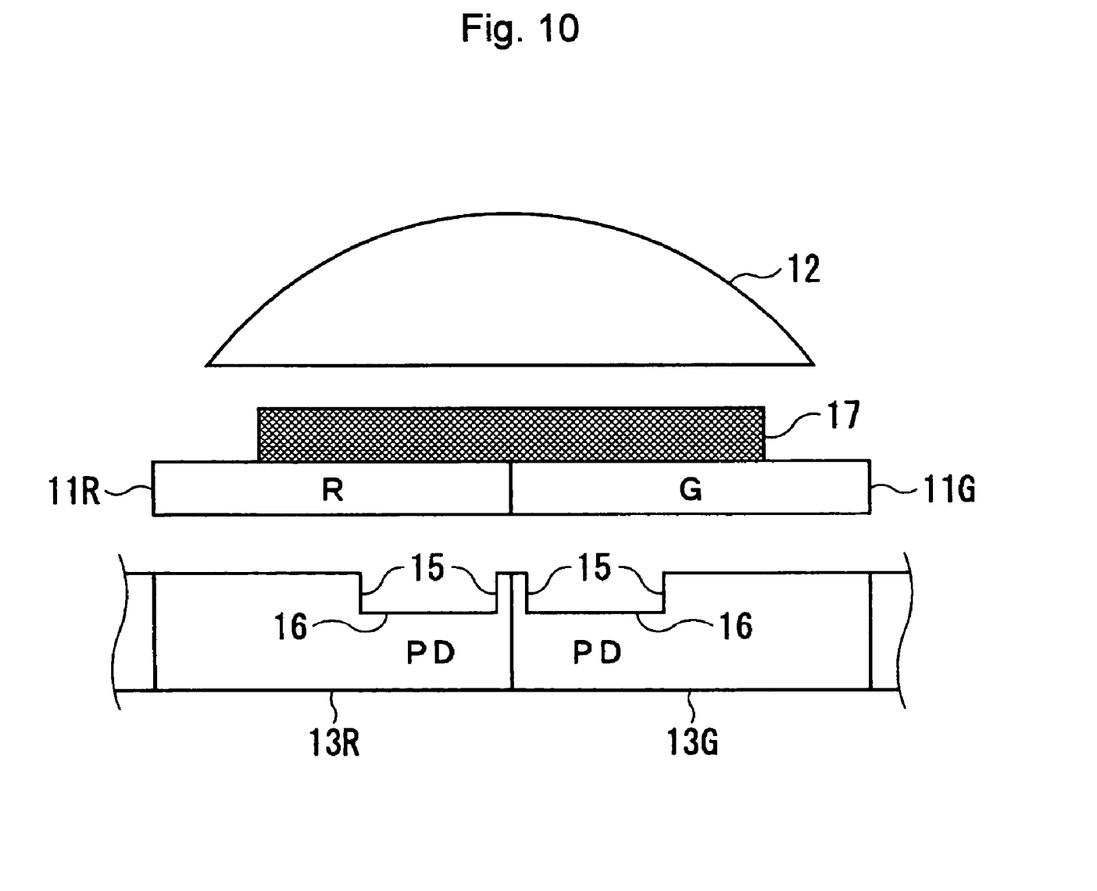
FIG. 10 illustrates a cross section along x-x line in the FIG. 9.

The structure of the fifth embodiment is explained below with reference to FIG. 9 and FIG. 10. FIG. 9 illustrates an enlarged pixel-block 143 of an imaging device 103. FIG. 10 illustrates a cross section along x-x line in the FIG. 9. The same symbol is used for the structure that is the same as that in the first embodiment. The fifth embodiment is different from the first embodiment mainly regarding an imaging device comprising a diffusion filter.

The imaging device 103 comprises a diffusion filter 17. A single diffusion filter covers a first, a second, and a third pixel 13R, 13G, and 13B. A diffusion filter is mounted between RGB color filters 11R, 11G, 11B and a micro lens 12. The other structures are the same as those of first embodiment.

Figure 11:
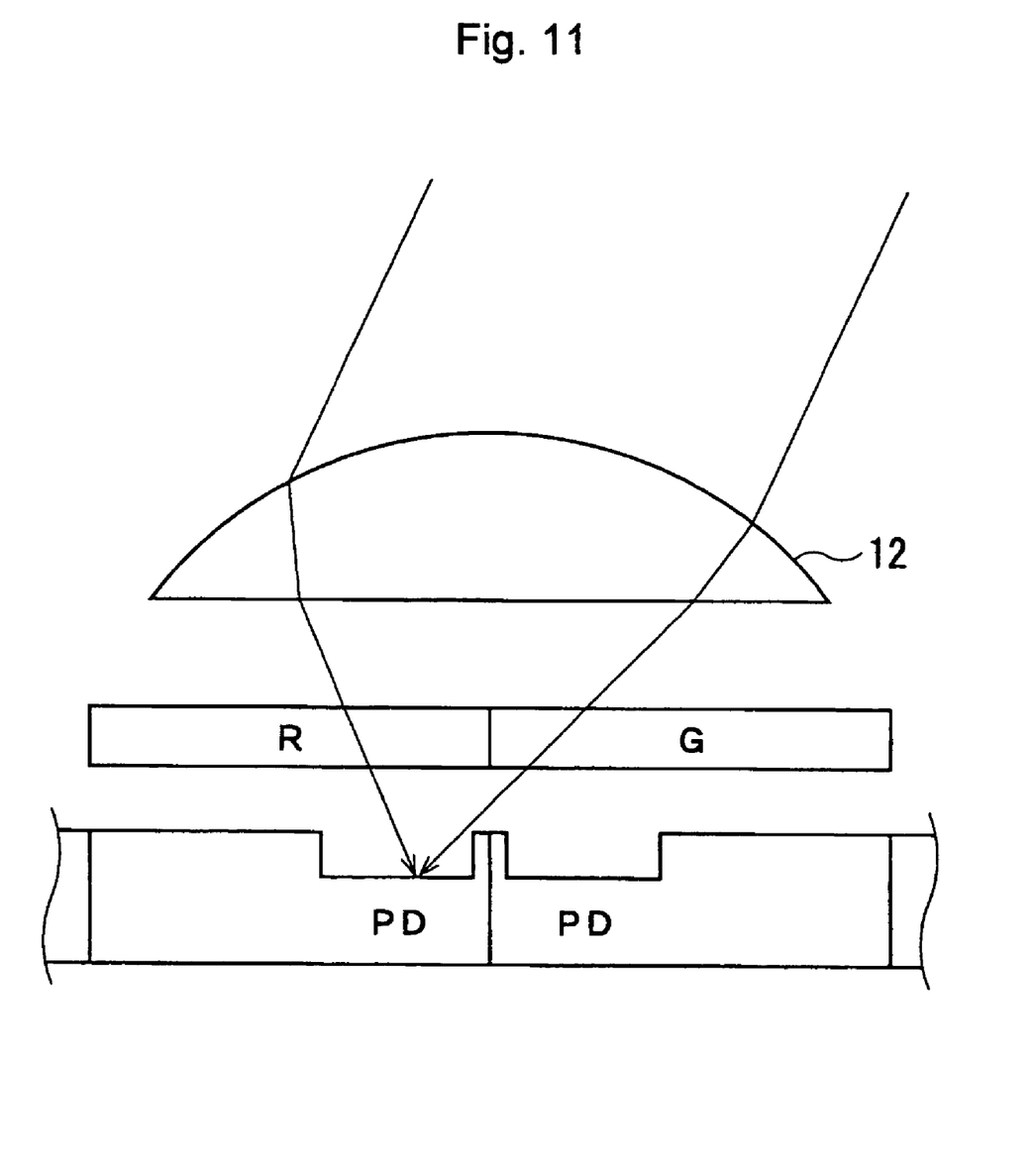
FIG. 11 illustrates an optical path of obliquely incident light, to a micro lens of the first embodiment.
Figure 12:
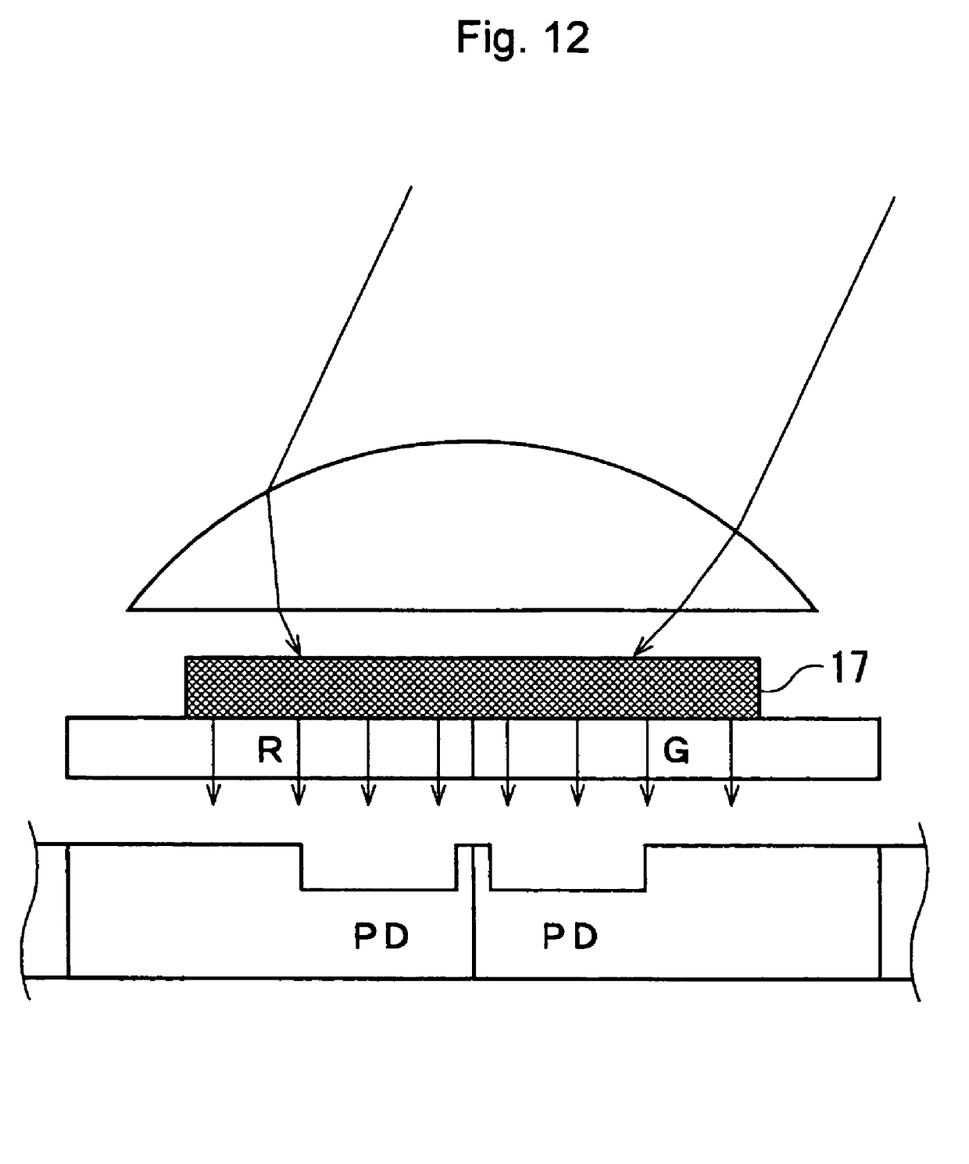
FIG. 12 illustrates an optical path of an obliquely incident light to micro lens of the fifth embodiment.

The effect of the fifth embodiment is explained below with FIG. 11 and FIG. 12. FIG. 11 illustrates an optical path of light obliquely incident to the micro lens 12 of the first embodiment. FIG. 12 illustrates an optical path of light obliquely incident to the micro lens 12 of the fifth embodiment.

The amount of light received by a first, second, and third pixel 13R, 13G, and 13B in the first embodiment may vary depending on the light incident direction to the micro lens 12. The variance in the amount of light received by a first, second, and third pixel 13R, 13G, and 13B may result in capturing an inaccurate image.

On the other hand, the light intensity is equal to that over whole emergent plane of a diffusion filter 17, even if the light is incident to the micro lens 12 and the diffusion filter 17 from any direction. Consequently, the same amount of light is incident to a first, second, and third pixel 13R, 13G, and 13B of a pixel-block 143, resulting in capturing a more accurate image.

In the above embodiments, a display-block 25 corresponding to a pixel-block 14, has the same relative location on a monitor surface as that of the pixel-block 14 on the image receiving surface. The CPU 20 correlates the output of RGB signals output from one pixel-block 14 so that the display-block 25 corresponds to the pixel-block. However, the location of a pixel-block may correspond to a relative location of an image-block for one frame of a captured image, displayed in a reduced or magnified display area of a monitor. And CPU 20 may correlate RGB signals output from one pixel-block 14 with the image-block corresponding to the pixel-block in the reduced or magnified display area.

In the above embodiments, an imaging device is connected to a CPU 20 via an A/D converter 23, and a CPU carries out some signal processes. However, an imaging device may comprise an A/D converter 23 and a signal processor, which carries out the same signal processes as the CPU 20. An A/D converter 23 and a signal processor can be mounted in the CMOS imaging device. Such an imaging device can correlate each set of RGB signals to a display-block corresponding to a pixel-block which outputs the RGB signals.

In the above embodiments, the arrangements of pixels and the color filters are decided. However, any arrangements are adaptable for these embodiments as long as a first, a second, and a third pixel, neighboring each other, are covered by a single micro lens.

In the second embodiment, an area of a second pixel is twice as large as that of a first, or a third pixel. However, a second pixel may be divided into two pixels successively arranged. Such a modification enables a simple color filter arrangement the same as that of the second embodiment. In addition, the areas and structures of all the pixels are equal, resulting in easier manufacturing.

In the third embodiment, a fourth pixel is covered with a G filter, of which the transmittance is higher than that of a second pixel. However, a fourth pixel can be covered with an R or B filter, of which the transmittance is higher than that of a first or a third pixel. In the embodiment, the fourth pixel is covered with a G filter because it is preferable for capturing an accurate image. This is because the G signal has a much wide sensitivity range for luminance signals.

In the fourth embodiment, a fourth pixel comprises a transparent and colorless material. However, a fourth pixel may not comprise any materials between the micro lens and PD. An imaging device has the same effect as the fourth embodiment as long as light transmittance in a space between a micro lens and a PD of a fourth pixel is equal for the whole range of visible light. The PD 16 in the fourth pixel can receive visible light without absorbing a particular light component, having a wavelength in the range of visible light.

In the fifth embodiment, a diffusion filter is mounted between the RGB color filters and a micro lens. However, a diffusion filter may be mounted between a first, a second, and a third pixel. Furthermore, the fifth embodiment may be adapted to the second, the third, and the fourth embodiment.

Although R, G, and B color filters are used in all the embodiments, however any other combination of color filters, of which colors can make all other colors, is adaptable.

Note that the imaging device is not restricted to the CMOS imaging device of the above all embodiments, but it can be any type of similar imaging device, such as CCD, CMD, BASIS, SIT, and the like.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Applications Nos. 2004-179642 (filed on Jun. 17, 2004) and 2005-153694 (filed on May 26, 2005), which are expressly incorporated herein, by reference, in their entirety.

The invention claimed is:

1. A solid state imaging device, comprising:
   a first pixel having a first color filter;
   a second pixel having a second color filter, of which the color is different from the color of said first color filter;
   a third pixel having a third color filter, of which the color is different from the colors of said first color filter and said second color filter;
   a single micro lens covering said first pixel, said second pixel, and said third pixel neighboring each other; and
   a fourth pixel covered by said single micro lens, said fourth pixel having a fourth color filter, of which the color is the same as that of said first color filter, and of which the transmittance is higher than that of said first color filter.

2. A solid state imaging device according to claim 1, further comprising a diffusion filter between said micro lens and said first, said second, and said third pixels.

3. A solid state imaging device according to claim 1, wherein said first, said second, and said third pixels comprise a photoelectric conversion element, that is arranged near an optical axis of said micro lens.

4. A signal processor for said solid state imaging device according to claim 1, comprising:
   an input portion receiving an image signal output from said solid state imaging device; and
   an output portion sending said image signal to a monitor for displaying an image captured by said imaging device;
   said image signal comprising first, second, third, and fourth signals respectively generated by said first, said second, said third, and said fourth pixels;
   said first, said second, said third, and said fourth pixels, being covered by said single micro lens, comprising a pixel-block;
   said monitor comprising a display surface;
   said display surface being divided into a plurality of display-blocks;
   said display-blocks corresponding to said pixel-blocks;
   said first color filter corresponding to a first color;
   said fourth signal being output as a signal of said first color for said display-block corresponding to said pixel-block when said fourth signal is less than a designated threshold level; and
   said first signal being output as said signal of said first color for said display-block corresponding to said pixel-block when said fourth signal exceeds said designated threshold level.

5. A signal processor according to claim 4, wherein said fourth pixel comprises a photoelectric conversion element, said photoelectric conversion element generating a saturation signal, said saturation signal being the highest level signal, that said photoelectric conversion element can generate, and said designated threshold level being decided based on a level of said fourth signal, so that said fourth signal is less than said saturation signal.

6. A solid state imaging device comprising:
   a first pixel having a first color filter;
   a second pixel having a second color filter, of which the color is different from the color of said first color filter;
   a third pixel having a third color filter, of which the color is different from the colors of said first color filter and said second color filter;
   a single micro lens covering said first pixel, said second pixel, and said third pixel neighboring each other; and
   a fourth pixel covered by said single micro lens, said fourth pixel comprising a photoelectric conversion element, and a transmittance of a range between said micro lens and said photoelectric conversion element being equal to the whole range of visible light.

7. A solid state imaging device according to claim 6, wherein said fourth pixel is covered by a transparent and colorless material.

8. A solid state imaging device according to claim 6, wherein said fourth pixel generates a fourth signal, wherein a luminance signal at said first, said second, said third, and said fourth pixel covered by said single micro lens is generated based on said fourth signal.

9. A signal processor for said solid state imaging device according to claim 6, comprising:
   an input portion receiving an image signal output from said solid state imaging device;
   said image signal comprising first, second, third, and fourth signals respectively generated by said first, said second, said third, and said fourth pixels;
   said luminance signal at said first, said second, said third, and said fourth pixel covered by said single micro lens, being generated based on said fourth signal.

10. A solid state imaging device according to claim 6, further comprising a diffusion filter between said micro lens and said first, said second, and said third pixels.

11. A solid state imaging device according to claim 6, wherein said first, said second, and said third pixels comprise a photoelectric conversion element, that is arranged near an optical axis of said micro lens.

* * * * *